(12) United States Patent
Otsuka et al.

(10) Patent No.: US 8,168,378 B2
(45) Date of Patent: May 1, 2012

(54) SUBSTRATE TREATMENT SYSTEM, SUBSTRATE TREATMENT METHOD, AND COMPUTER READABLE STORAGE MEDIUM

(75) Inventors: Takahisa Otsuka, Koshi (JP); Tsuyoshi Shibata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/852,855

(22) Filed: Aug. 9, 2010

(65) Prior Publication Data

US 2010/0323306 A1 Dec. 23, 2010

Related U.S. Application Data

(62) Division of application No. 11/627,540, filed on Jan. 26, 2007, now Pat. No. 7,816,276.

(30) Foreign Application Priority Data

Feb. 10, 2006 (JP) ................................. 2006-034089

(51) Int. Cl.
*G03F 7/00* (2006.01)
*G03F 7/26* (2006.01)
*G03F 7/40* (2006.01)

(52) U.S. Cl. ..................... 430/331; 430/270.1; 430/330; 430/311

(58) Field of Classification Search ............... 430/270.1, 430/311, 330, 331
See application file for complete search history.

(56) References Cited

U.S. PATENT DOCUMENTS

| | | | |
|---|---|---|---|
| 6,451,515 B2 | 9/2002 | Takamori et al. | |
| 6,518,199 B2 | 2/2003 | Kitano et al. | |
| 6,884,298 B2 * | 4/2005 | Kitano et al. | 118/719 |
| 7,628,612 B2 * | 12/2009 | Otsuka et al. | 432/247 |
| 7,816,276 B2 * | 10/2010 | Otsuka et al. | 438/758 |

FOREIGN PATENT DOCUMENTS

| | | |
|---|---|---|
| JP | 61-156814 | 7/1986 |
| JP | 1-209722 | 8/1989 |
| JP | 2-3910 | 1/1990 |
| JP | 8-222503 | 8/1996 |
| JP | 2001-85323 | 3/2001 |
| JP | 2001-168009 | 6/2001 |

OTHER PUBLICATIONS

Japanese Office Action dated Jun. 1, 2010. Corresponds with Application No. 2006-034089, with English translation, 8 pages.

* cited by examiner

*Primary Examiner* — Amanda C. Walke
(74) *Attorney, Agent, or Firm* — Oblon, Spivak, McClelland, Maier & Neustadt, L.L.P.

(57) ABSTRACT

In the present invention, a plurality of heat treatment plates are provided side by side in a linear form on a base of a heat treatment apparatus in a coating and developing treatment system. In the heat treatment apparatus, three transfer member groups are provided which transfer a substrate in zones between adjacent heat treatment plates. At the time when performing a pre-baking treatment in the heat treatment apparatus, the substrate is transferred in order to the heat treatment plates at the same temperature, whereby the heat treatment is dividedly performed on the heat treatment plates. According to the present invention, substrates are subjected to heat treatment along the same route, so that the thermal histories are made uniform among the substrates.

5 Claims, 16 Drawing Sheets

SUBSTRATE TREATMENT SYSTEM, SUBSTRATE TREATMENT METHOD, AND COMPUTER READABLE STORAGE MEDIUM

CROSS-REFERENCE TO RELATED APPLICATIONS

This application is a divisional of U.S. patent application Ser. No. 11/627,540, filed Jan. 26, 2007, and claims priority to Japanese Patent Application No. 2006-034089, filed Feb. 10, 2006. The entire contents of U.S. application Ser. No. 11/627,540 are incorporated herein by reference in their entirety.

BACKGROUND OF THE INVENTION

1. Field of the Invention

The present invention relates to a substrate treatment system, a substrate treatment method, and a computer readable storage medium.

2. Description of the Related Art

In a photolithography process in a manufacturing process of a semiconductor device, for example, a resist coating treatment of applying a resist solution, for example, to a wafer, a heat treatment of drying the resist solution (pre-baking treatment), a heat treatment of accelerating chemical reaction in the resist film after the resist film is exposed to a predetermined pattern (post exposure-baking treatment), a developing treatment of developing the resist film, a heat treatment of heating the wafer after the developing treatment, and so on are performed in order, to thereby form a predetermined resist pattern on the wafer.

A series of the above-described wafer treatments is sequentially performed in a coating and developing treatment system incorporating a resist coating treatment apparatus for performing the resist coating treatment, a developing treatment apparatus for performing the developing treatment, heat treatment apparatuses for performing the above-described various kinds of heat treatments, a transfer unit for performing transfer of the wafer between the treatment apparatuses.

The above-described coating and developing treatment system incorporates a plurality of the above-described resist coating apparatuses, developing treatment apparatuses, and heat treatment apparatuses respectively, in order to improve the throughput of the wafer treatment. At the time when performing the wafer treatment in the coating and developing treatment system, a plurality of wafers are divided into a plurality of treatment apparatuses which perform the same treatment, in each of the treatment steps, so that the plurality of wafers are treated in parallel by those treatment apparatuses during the same time (Japanese Patent Application Laid-open. No. 2001-85323).

However, where the plurality of wafers are divided into the plurality of treatment apparatuses as described above so that the wafers are treated in parallel, there are individual differences between the treatment apparatuses, thus causing variation in the state of the wafer after the treatment depending on the treatment apparatus performing the treatment. For example, the film thickness of the resist solution varies in the case of the resist coating treatment, and the shape and dimension of the resist film after development varies in the developing treatment. Besides, the thermal history varies in the case of the heat treatment.

In addition, even in the case of the treatment apparatuses for performing the same kind of treatment, the transfer route and the transfer time of the wafer vary depending on the installation position of the treatment apparatus. This also affects the state of the wafer after the treatment.

As described above, when the wafers are divided into the plurality of treatment apparatuses and treated in parallel, the treatment states in the resist coating treatment, the developing treatment, the heat treatment and so on vary between the wafers to cause variation in the dimension of the finally formed resist pattern.

SUMMARY OF THE INVENTION

The present invention has been developed in consideration of the above viewpoints, and its object is to suppress variation in dimension of a resist pattern among substrates such as wafers.

The present invention to achieve the above object is a substrate treatment system for forming a resist pattern on a substrate, including at least a coating treatment apparatus for applying a resist solution to the substrate, a developing treatment apparatus for performing a developing treatment for the substrate, and a heat treatment apparatus for performing a heat treatment for the substrate, wherein at least any of the coating treatment apparatus, developing treatment apparatus, and heat treatment apparatus includes a plurality of treatment units for dividedly performing the treatment.

According to the present invention, in any of the coating treatment apparatus, the developing treatment apparatus, and the heat treatment apparatus, each kind of treatment can be dividedly performed in the plurality of treatment units. Accordingly, the substrates can be treated via the same route and history to uniform the states of the substrates after the treatment. As a result, the variation in the finally formed resist pattern among the substrates can be suppressed.

According to another aspect, the present invention is a substrate treatment method for forming a resist pattern on a substrate, including at least a coating treatment of applying a resist solution to the substrate, a substrate developing treatment, and a substrate heat treatment, wherein at least any of the coating treatment, developing treatment, and heat treatment is performed by transferring the substrate in order to a plurality of treatment units where the treatment is dividedly performed.

According to still another aspect, the present invention is a computer readable storage medium storing a computer program when performing treatments for a substrate using a substrate treatment system, wherein the treatment for the substrate includes at least a coating treatment of applying a resist solution to the substrate, a substrate developing treatment, and a substrate heat treatment, and wherein at least any of the coating treatment, developing treatment, and heat treatment is performed by transferring the substrate in order to a plurality of treatment units where the treatment is dividedly performed.

According to the present invention, for example, the resist patterns can be formed uniform among the substrates to improve yields.

DETAILED DESCRIPTION OF THE INVENTION

Figure 1:
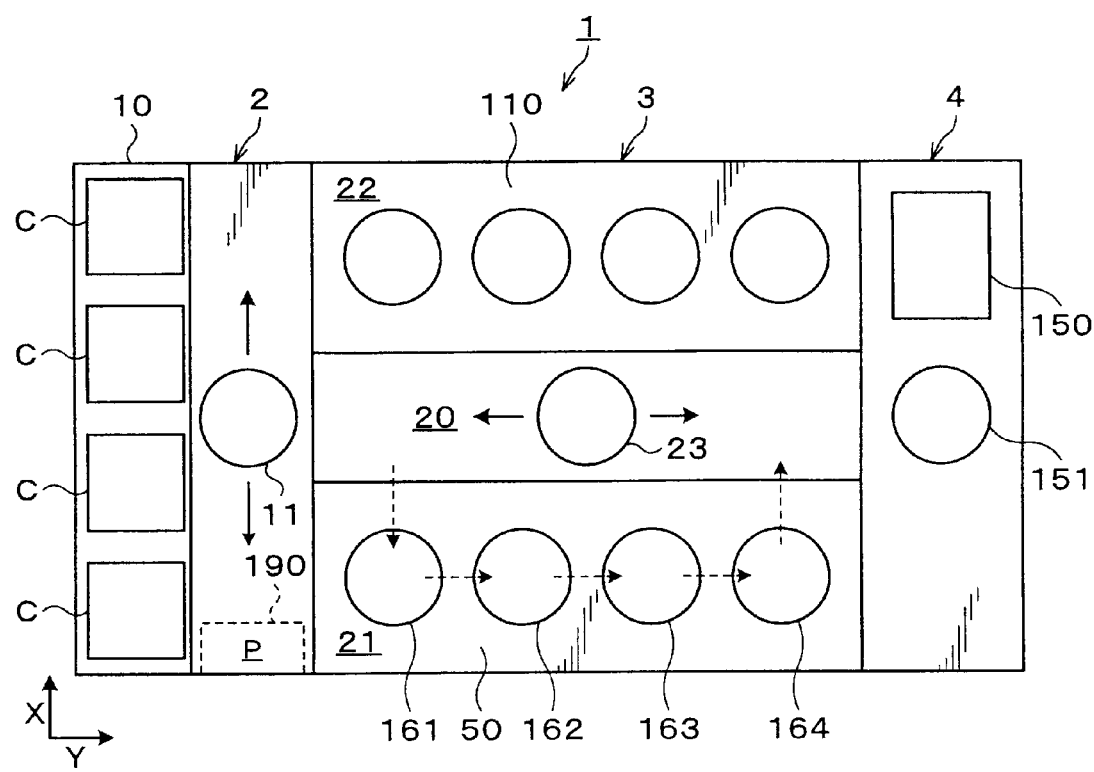
FIG. 1 is a plan view showing the outline of a configuration of a coating and developing treatment system according to the present embodiment.
Figure 2:
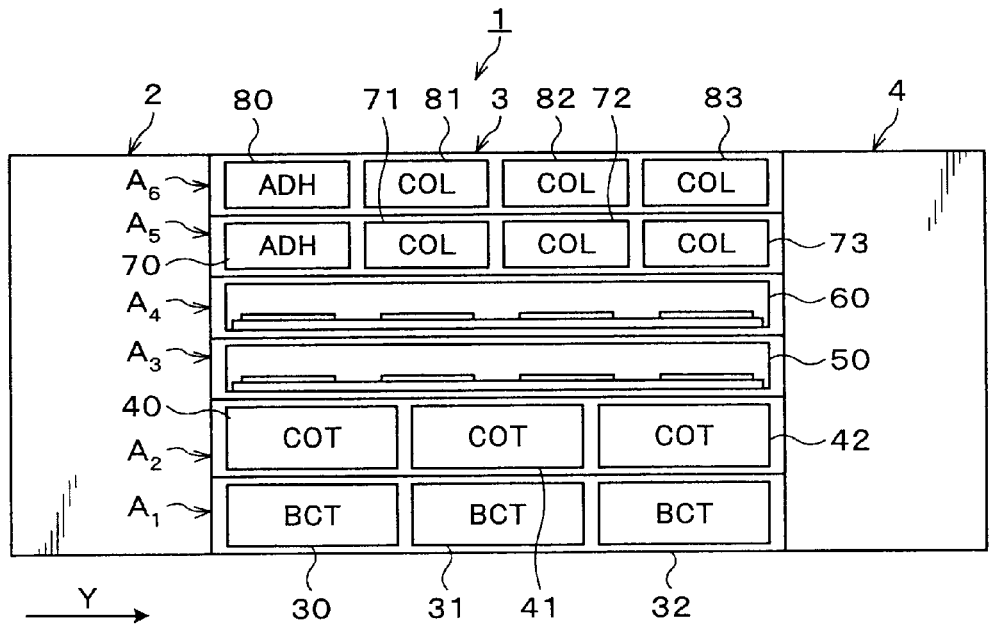
FIG. 2 is a front view of the coating and developing treatment system.
Figure 3:
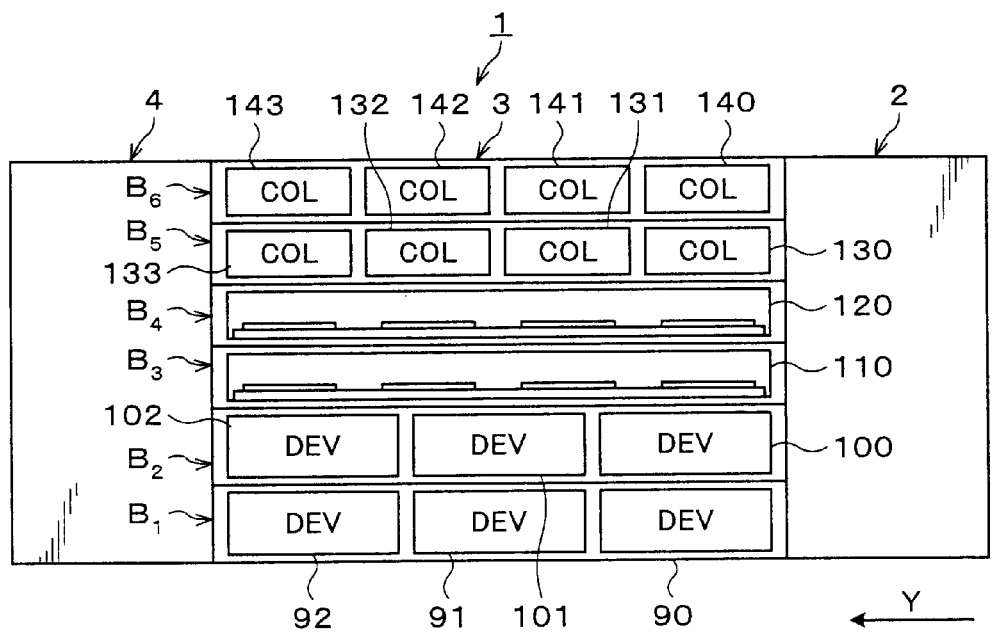
FIG. 3 is a rear view of the coating and developing treatment system.

Hereinafter, preferred embodiments of the present invention will be described. FIG. 1 is a plan view showing the outline of a configuration of a coating and developing treatment system 1 as a substrate treatment system according to the present embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, a plurality of wafers W per cassette as a unit from/to the outside into/from the coating and developing treatment system 1 and transferring the wafers W into/out of a cassette C; a treatment station 3 including a plurality of various kinds of treatment apparatuses, which are multi-tiered, for performing various kinds of treatments in a photolithography process; and an interface station 4 for passing the wafer W to/from a not-shown aligner provided adjacent to the treatment station 3, are integrally connected.

In the cassette station 2, a cassette mounting table 10 is provided which mounts a plurality of cassettes C thereon. In the cassette station 2, a wafer transfer body 11 is further provided which transfers the wafer W, for example, between the cassette C and a later-described main transfer unit 23 in the treatment station 3.

In the treatment station 3, a transfer section 20 is formed extending in a Y-direction (in a left-to-right direction in FIG. 1) at the middle portion. Two treatment regions 21 and 22 housing the plurality of treatment apparatuses are arranged on both sides in an X-direction (a top-to-bottom direction in FIG. 1) of the transfer section 20. In the transfer section 20, the main transfer unit 23 movable in the Y-direction is provided and can transfer the wafer W between arbitrary treatment apparatuses in the later-described first and second treatment regions 21 and 22. The main transfer unit 23 can also transfer the wafer W from/to various kinds of treatment apparatuses in the first and second treatment regions 21 and 22 to/from the wafer transfer body 11 in the cassette station 2 and a wafer transfer body 151 in the interface station 4.

The first treatment region 21 is provided on the front side being the negative direction side in the X-direction (the downward direction in FIG. 1) in the treatment station 3. The first treatment region 21 has, for example, a vertically six-tiered structure as shown in FIG. 2, a single treatment apparatus or a plurality of treatment apparatuses being mounted on each tier. For example, on a first tier A1 being the lowermost tier, three bottom coating apparatuses 30, 31 and 32 each for forming an anti-reflection film to prevent reflection of light at the time of exposure processing are provided in order from the cassette station 2 side toward the interface station 4 side (the positive direction side in the Y-direction). On a second tier A2, three resist coating apparatuses 40, 41, and 42 each for applying a resist solution to the wafer W are provided in order toward the positive direction side in the Y-direction.

On a third tier A3 and a fourth tier A4, heat treatment apparatuses 50 and 60 to which the present invention is applied are provided. On a fifth tier A5, for example, an adhesion apparatus 70 for performing hydrophobic treatment on the wafer W and three cooling apparatuses 71, 72, and 73 each for cooling the wafer W are provided in order toward the positive direction side in the Y-direction. On a sixth tier A6, for example, an adhesion apparatus 80 and cooling apparatuses 81, 82, and 83 are provided, as in the fifth tier A5, in order toward the positive direction side in the Y-direction.

The second treatment region 22 is provided on the rear side being the positive direction side in the X-direction (the upward direction in FIG. 1) in the treatment station 3. The second treatment region 22 has, for example, a vertically six-tiered structure as in the first treatment region 21 as shown in FIG. 3, a single treatment apparatus or a plurality of treatment apparatuses being mounted on each tier. For example, on a first tier B1 being the lowermost tier, for example, three developing treatment apparatuses 90, 91, and 92 each for performing developing treatment on the wafer W are provided in order toward the positive direction side in the Y-direction. On a second tier B2, three developing treatment apparatuses 100, 101, and 102 are provided, for example, as in the first tier B1, in order toward the positive direction side in the Y-direction.

On a third tier B3 and a fourth tier B4, heat treatment apparatuses 110 and 120 are provided. On a fifth tier B5, for example, four cooling apparatuses 130, 131, 132, and 133 are provided in order toward the front direction side in the Y-direction. On a sixth tier B6, for example, four cooling apparatuses 140, 141, 142, and 143 are provided, as in the fifth tier B5, in order toward the positive direction side in the Y-direction.

In the interface station 4, for example, an edge exposure apparatus 150 is provided which exposes the edge portion of the wafer W to light, for example, as shown in FIG. 1. Further, at the middle portion of the interface station 4, the wafer transfer body 151 is provided which transfers the wafer W between the above-described main transfer unit 23 and the edge exposure apparatus 150 and the not-shown aligner.

Figure 4:
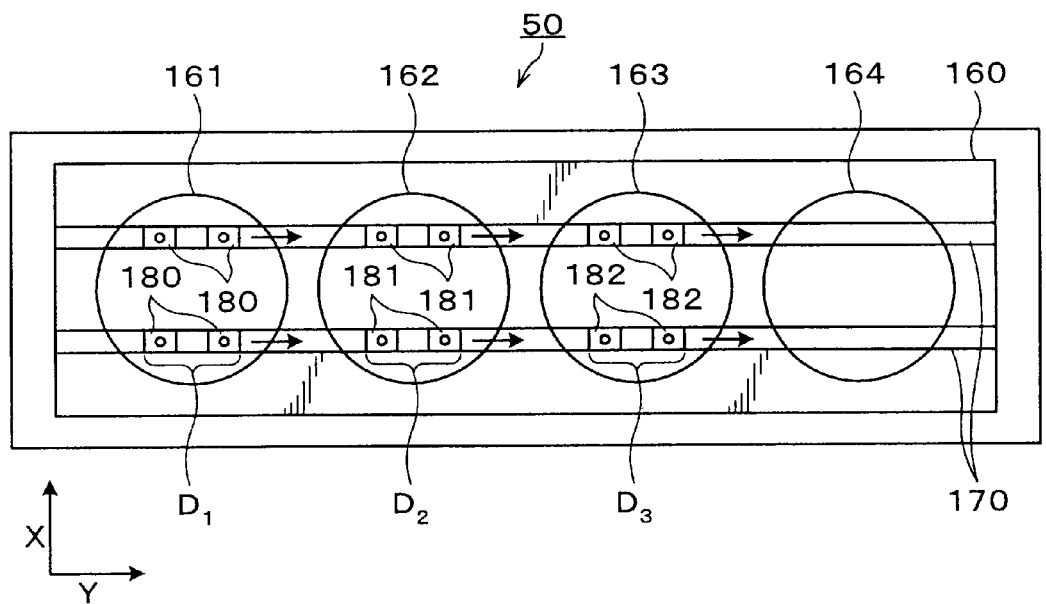
FIG. 4 is a plan view showing the outline of a configuration of a heat treatment apparatus.

Next, the configuration of the above-described heat treatment apparatus 50 will be described. The heat treatment apparatus 50 has a base 160 in a flat plate elongated in the Y-direction as shown in FIG. 4. On the base 160, for example, four heat treatment plates 161, 162, 163, and 164 as the heat treatment apparatuses each for mounting and heating the wafer W thereon are provided side by side in order toward the positive direction side in the Y-direction.

Figure 5:
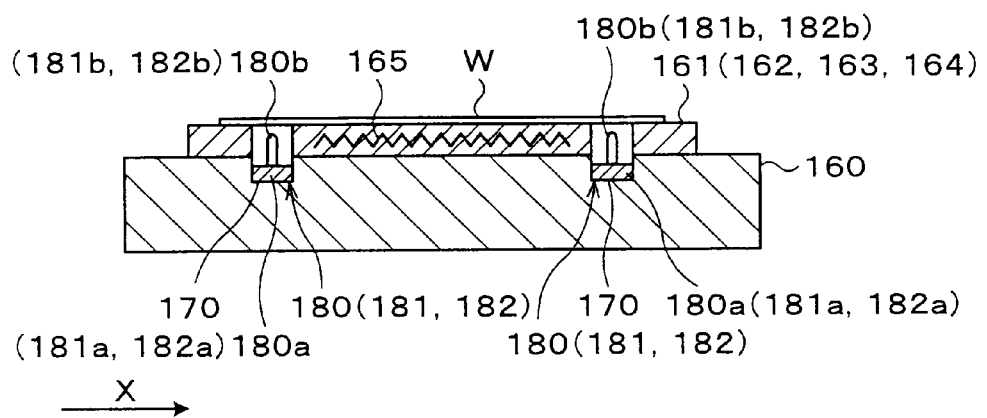
FIG. 5 is a longitudinal sectional view of a base and a heat treatment plate.

For example, the first heat treatment plate 161 is formed in a thick disk shape as shown in FIG. 5. Inside the first heat treatment plate 161, a heater 165 is embedded which generates heat by power feeding. The heater 165 can be used to set the first heat treatment plate 161 to a predetermined temperature. The other second heat treatment plate 162, third heat treatment plate 163, and fourth heat treatment plate 164 have the same configuration as that of the first heat treatment plate 161, each having a disk shape and including the heater 165 therein. Note that control of the temperature of each of the heat treatment plates 161 to 164 is conducted by, for example, a later-described control unit 190.

As shown in FIG. 4, the front surface of the base 160 is formed with two grooves 170 extending in parallel in the Y-direction. The grooves 170 are formed passing under the heat treatment plates 161 to 164. In the grooves 170, a first transfer member group D1 for transferring the wafer W between the first heat treatment plate 161 and the second heat treatment plate 162, a second transfer member group D2 for transferring the wafer W between the second heat treatment plate 162 and the third heat treatment plate 163, and a third transfer member group D3 for transferring the wafer W between the third heat treatment plate 163 and the fourth heat treatment plate 164 are provided.

Figure 6:
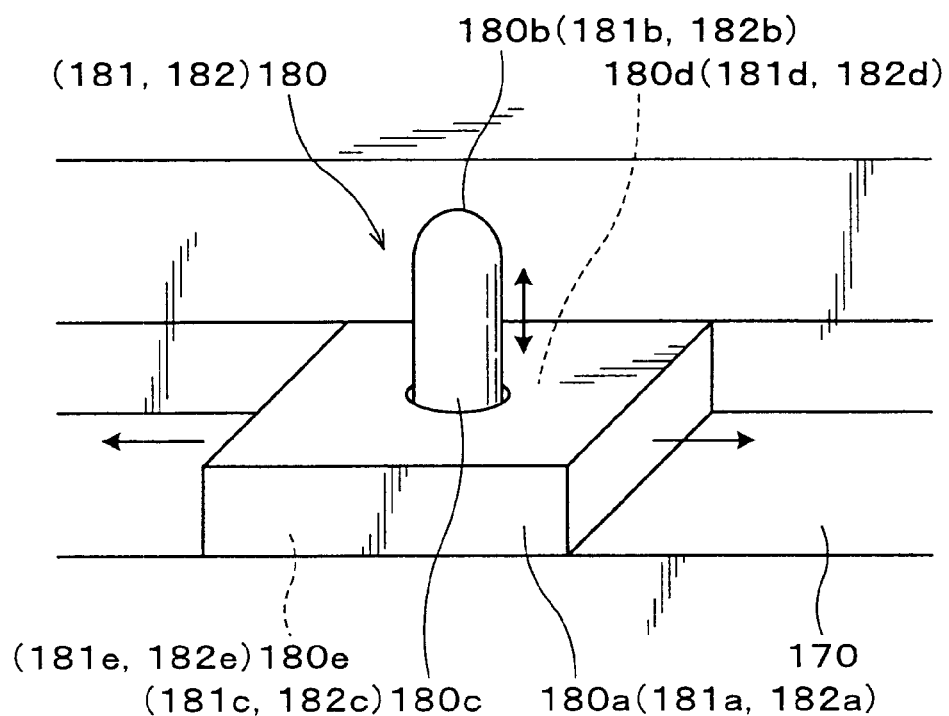
FIG. 6 is an explanatory view showing a configuration of a transfer member.

The first transfer member group D1 is composed of, for example, four transfer members 180. The transfer members 180 are arranged, two each for one groove 170. Each of the transfer members 180 includes, for example, as shown in FIG. 6, a slider portion 180a in a square flat plate form and a pin portion 180b provided at the slider portion 180a. The pin portion 180b is provided in a hole 180c formed, for example, at the center of the slider 180a and can be raised and lowered, for example, by a raising and lowering drive portion 180d such as a cylinder embedded in the slider portion 180a. The pin portions 180b can protrude from within the grooves 170 to positions above the heat treatment plates 161 and 162. The slider portion 180a can horizontally move in the groove 170, for example, by means of a horizontal drive portion 180e such as an embedded motor. The transfer members 180 in the first transfer member group D1 can move the slider portions 180a in the Y-direction while supporting the wafer W by the pin portions 180b to thereby transfer the wafer W between the first heat treatment plate 161 and the second heat treatment plate 162.

The second transfer member group D2 and the third transfer member group D3 have the same configuration as that of the above-described first transfer member group D1. The second transfer member group D2 is composed of four transfer members 181, each of the transfer members 181 having a slider portion 181a, a pin portion 181b, a hole 181c, a raising and lowering drive portion 181d, and a horizontal drive portion 181e as shown in FIG. 6. The third transfer member group D3 is composed of four transfer members 182, each of the transfer members 182 having a slider portion 182a, a pin portion 182b, a hole 182c, a raising and lowering drive portion 182d, and a horizontal drive portion 181e. Note that the first to third transfer member groups D1 to D3 constitute a substrate transfer mechanism in this embodiment.

The heat treatment apparatuses 60, 110, and 120 have the same configuration as that of the above-described heat treatment apparatus 50 in this embodiment and therefore their description will be omitted.

The control of the wafer treatment performed in the coating and developing treatment system 1 as described above is conducted by the control unit 190 provided in the cassette station 2, for example, as shown in FIG. 1. The control unit 190 is, for example, a computer and has a program storage unit. The program storage unit stores a program P to control the operations of the heaters 165 in the heat treatment plates 161 to 164 in the above-described heat treatment apparatus 50 and the transfer members 180 to 182 so as to execute the wafer treatment following a predetermined recipe. Note that the program P may be recorded on a computer readable recording medium and installed from the recording medium into the control unit 190.

Next, the treatment process performed in the coating and developing treatment system 1 configured as described above will be described.

First of all, a plurality of wafers W are successively taken out of the cassette C on the cassette mounting table 10 and delivered to the main transfer unit 23 in the treatment station 3 by the wafer transfer body 11. The wafers W are transferred one by one by the main transfer unit 23, for example, to the adhesion apparatus 80 on the sixth tier A6 in the first treatment region 21 where the wafer W is subjected to hydrophobic treatment, and then transferred to the cooling apparatus 81. The wafer W is then transferred, for example, to the resist coating apparatus 40 on the second tier A2 where a resist film is formed on the wafer W. The wafers W with the resist film formed thereon are transferred one by one by the main transfer unit 23 to the heat treatment apparatus 50 on the third tier A3 where the wafer W is subjected to heat treatment (pre-baking treatment). The pre-baking treatment in this embodiment shall perform heating for the wafer W at a set temperature of T° C. for S seconds.

Figure 7:
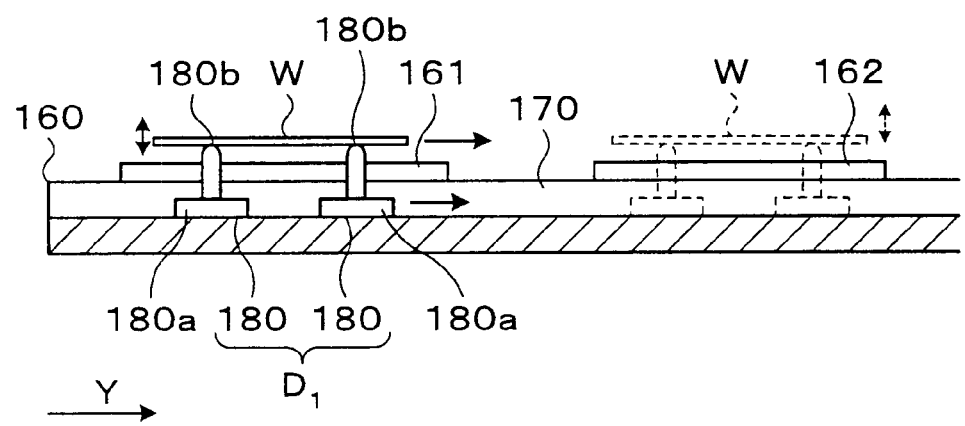
FIG. 7 is a longitudinal sectional view of a base for explaining transfer of a wafer from a first heat treatment plate to a second heat treatment plate.

The wafers W with the resist film formed thereon are transferred one by one by the main transfer unit 23 to the first heat treatment plate 161 lying on the negative direction side in the Y-direction in the heat treatment apparatus 50 as shown in FIG. 1. The wafer W in this event is delivered from the main transfer unit 23 to the pin portions 180b of the transfer members 180 in the first transfer member group D1 which have been previously raised and waiting as shown in FIG. 7. The pin portions 180b are then lowered so that the wafer W is mounted on the first heat treatment plate 161 which is temperature-set at T° C. The wafer W is heated on the first heat treatment plate 161, for example, for S/4 seconds. After completion of the heating, the pins portions 180b are raised to lift the wafer W from the first heat treatment plate 161. Subsequently, the slider portions 180a of the transfer members 180 are moved to the positive direction side in the Y-direction to move the wafer W to a position above the second heat treatment plate 162 (shown by a dotted line in FIG. 7). The pin portions 180b of the transfer members 180 are lowered so that the wafer W is mounted on the second heat treatment plate 162 which is temperature-set at T° C.

The wafer W mounted on the second heat treatment plate 162 is heated here also for S/4 seconds. During this time, the first transfer members 180 of the first transfer member group D1 are returned to the initial positions at the first heat treatment plate 161 and wait to receive the next wafer W. Further, the transfer members 181 of the second transfer member group D2 are moved to the positions at the second heat treatment plate 162 and wait there.

Figure 8:
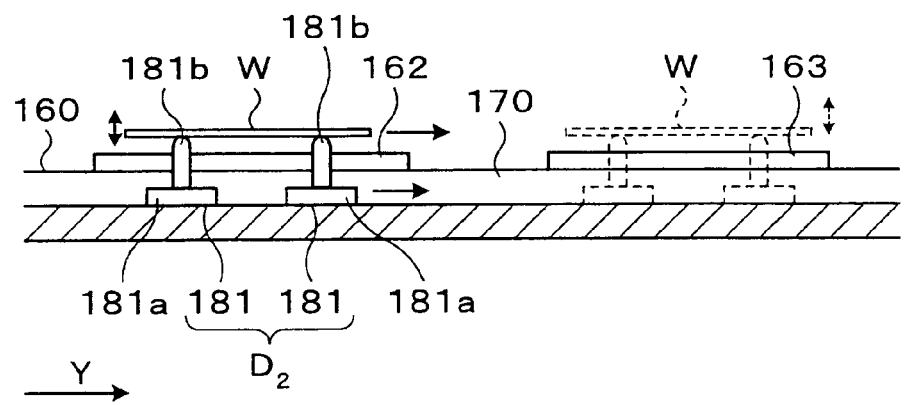
FIG. 8 is a longitudinal sectional view of the base for explaining transfer of the wafer from the second heat treatment plate to a third heat treatment plate.

The wafer W on the second heat treatment plate 162 is then lifted by the pin portions 181b of the transfer members 181 as shown in FIG. 8. Subsequently, the slider portions 181a are moved to the positive direction side in the Y-direction to move the wafer W to a position above the third heat treatment plate 163. The pin portions 181b are lowered so that the wafer W is mounted on the third heat treatment plate 163 which is temperature-set at T° C.

The wafer W mounted on the third heat treatment plate 163 is heated for S/4 seconds. During this time, the second transfer members 181 of the second transfer member group D2 are returned to the original positions at the second heat treatment plate 162 and wait to receive the next wafer W. Further, the transfer members 182 of the third transfer member group D3 are moved to the positions at the third heat treatment plate 163 and wait there.

Figure 9:
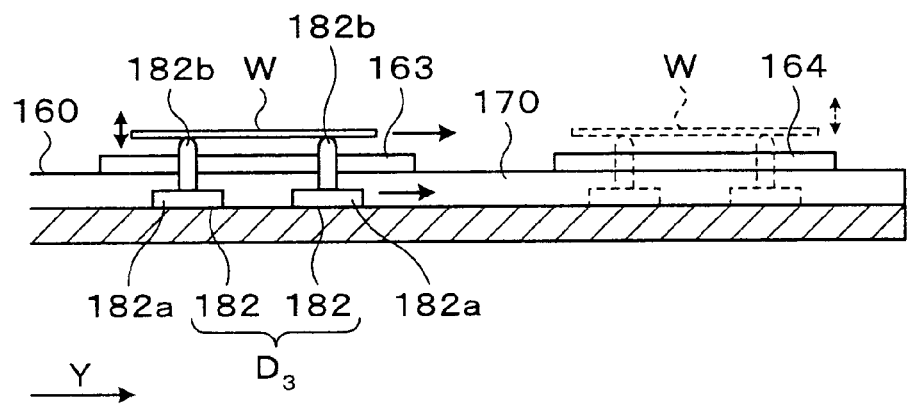
FIG. 9 is a longitudinal sectional view of the base for explaining transfer of the wafer from the third heat treatment plate to a fourth heat treatment plate.

The wafer W on the third heat treatment plate 163 is then lifted by the pin portions 182b of the transfer members 182 as shown in FIG. 9. Subsequently, the slider portions 182a are moved to the positive direction side in the Y-direction to move the wafer W to a position above the fourth heat treatment plate 164. The pin portions 182b are lowered so that the wafer W is mounted on the fourth heat treatment plate 164 which is temperature-set at T° C. and heated for S/4 seconds.

After completion of the heating by the heat treatment plate 164, the wafer W is lifted by the pins portions 182b of the transfer members 182 and delivered to the main transfer unit 23. The wafer W is then transferred out of the heat treatment apparatus 50, with which the pre-baking treatment at T° C. for S seconds in total for the wafer W ends. To the heat treatment apparatus 50, the wafers W are successively inserted, and those wafers W are successively transferred to the heat treatment plates 161 to 164 in series. As described above, a plurality of wafers W are successively treated during the same time in the heat treatment apparatus 50.

The wafer W for which the pre-baking treatment has been completed is transferred by the main transfer unit 23, for example, to the cooling apparatus 82 on the sixth tier A6 and cooled there. The wafer W is then delivered to the wafer transfer body 151 in the interface station 4, subjected to edge exposure processing in the edge exposure apparatus 150, and then transferred to the aligner. The wafer W for which the exposure processing in the aligner has been completed is returned by the wafer transfer body 151 into the treatment station 3, and transferred by the main transfer unit 23, for example, to the heat treatment apparatus 110 on the third tier B3 in the second treatment region 22. In the heat treatment apparatus 110, a plurality of wafers W are transferred one by one to the heat treatment plates, as in the above-described heat treatment apparatus 50, where the wafers W are subjected to predetermined heat treatment (post-exposure baking treatment).

The wafer W for which the post-exposure baking treatment has bee completed is transferred by the main transfer unit 23, for example, to the cooling apparatus 140 on the sixth tier B6 and cooled there, and the wafer W is then transferred, for example, to the developing treatment apparatus 100 on the second tier B2 where it is subjected to developing treatment. The wafer W for which the developing treatment has been completed is transferred to the heat treatment apparatus 120 on the fourth tier B4, where a plurality of wafers W are transferred one by one to the heat treatment plates, as in the above-described heat treatment apparatus 50, where the wafers W are subjected to predetermined heat treatment (post-baking treatment).

The wafer W is then transferred by the main transfer unit 23, for example, to the cooling apparatus 130 on the fifth tier B5 and cooled there, and the wafer W is then delivered by the main transfer unit 23 to the wafer transfer body 11 in the cassette station 2. The wafer W is then returned by the wafer transfer body 11 into the cassette C, with which a series of wafer treatments for forming a resist pattern ends.

According to the above embodiment, the four heat treatment plates 161 to 164 arranged in series in the heat treatment apparatus 50 are provided so that the pre-baking treatment can be dividedly performed on the heat treatment plates 161 to 164. In this case, every wafer W can pass through the same route for heat treatment, thus preventing variation among wafers in thermal history. As a result, the variation among wafers W in a dimension of the resist pattern finally formed on the wafer W can be prevented. Further, since the transfer member groups D1 to D3 are provided which transfer the wafer W in zones between adjacent heat treatment plates 161 to 164 in the heat treatment apparatus 50, the wafers W can be transferred one by one to the heat treatment plates 161 to 164 so that a plurality of wafers W can be successively treated during the same time. As a result, a decrease in throughput due to one heat treatment divided and performed in series can be also prevented.

Figure 10:
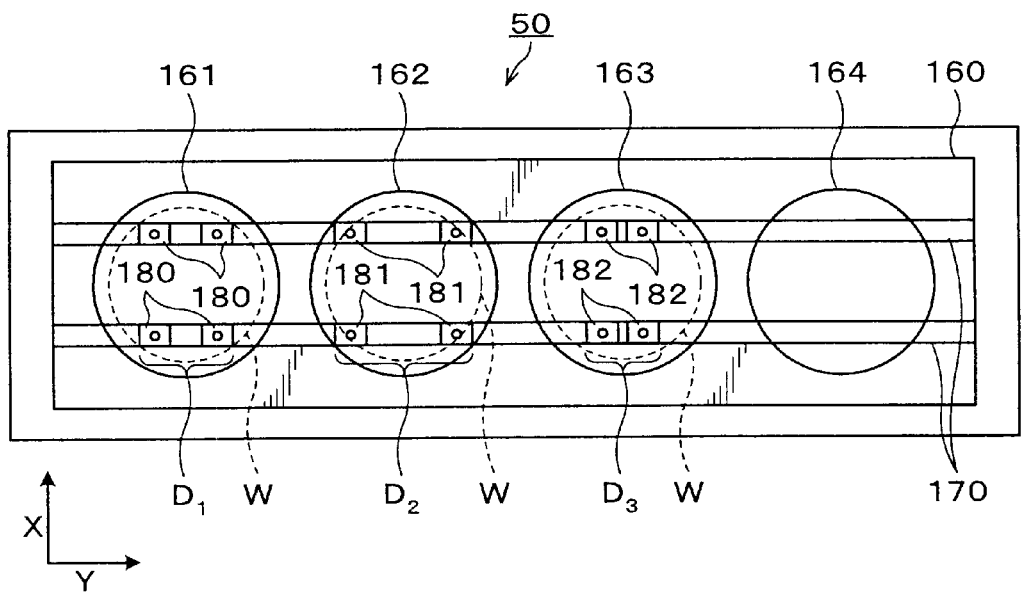
FIG. 10 is a plan view of the heat treatment apparatus in the case in which the positions of the transfer members are changed.

While the transfer members 180 to 182 for transferring the wafer W between the heat treatment plates 161 to 164 support the same position within the wafer in the above embodiment, the transfer members 180, 181, and 182 may support different positions within the wafer. For example, as shown in FIG. 10, the transfer members 181 of the second transfer member group D2 support positions closer to the outer periphery of the wafer W than the transfer members 180 of the first transfer member group D1, and the transfer members 182 of the third transfer member group D3 support positions closer to the center of the wafer W than the transfer members 180 of the first transfer member group D1. With this arrangement, the contact position between the wafer W and each of the transfer members 180, 181 and 182 can be changed when the wafer W is heated on the four heat treatment plates 161 to 164 in sequence, thereby preventing a decrease in temperature of a part of the wafer W due to a contact with the transfer members 180 to 182 to prevent variation in temperature within the wafer. As a result, the heat treatment of the wafer W is uniformly performed within the wafer.

Figure 11:
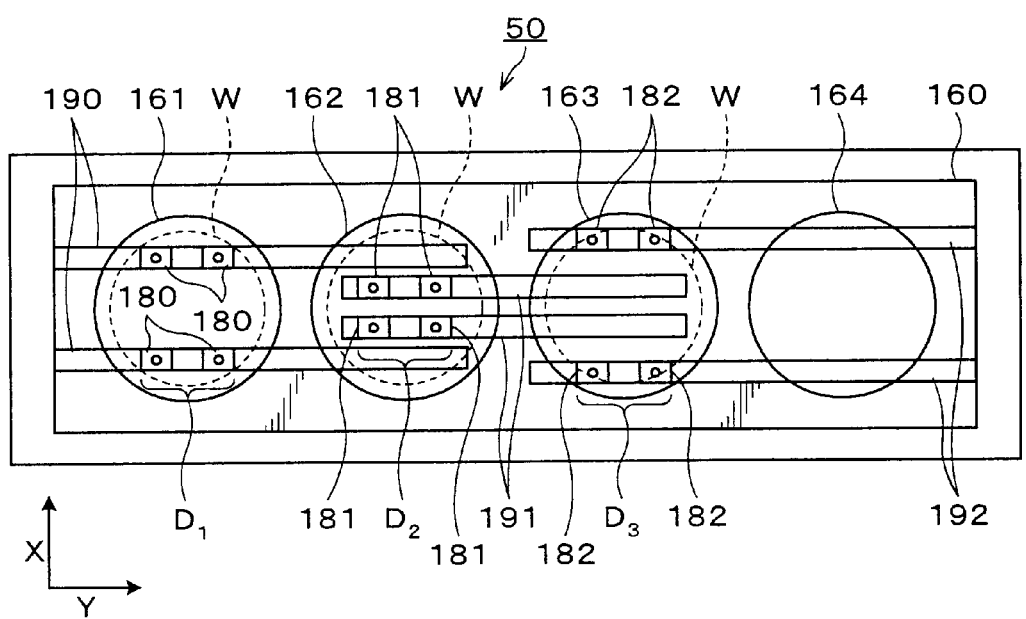
FIG. 11 is a plan view of the heat treatment apparatus in which a plurality of grooves are provided.

Further, grooves 190, 191, and 192, which are different in position in the X-direction on the base 160, may be provided two each in respective zones between adjacent heat treatment plates 161 to 164 as shown in FIG. 11, and the transfer members 180, 181, and 182 may be provided in the grooves 190, 191 and 192, respectively. This also makes it possible to shift in the X-direction the position where each of the transfer members 180 to 182 supports the wafer W.

Figure 12:
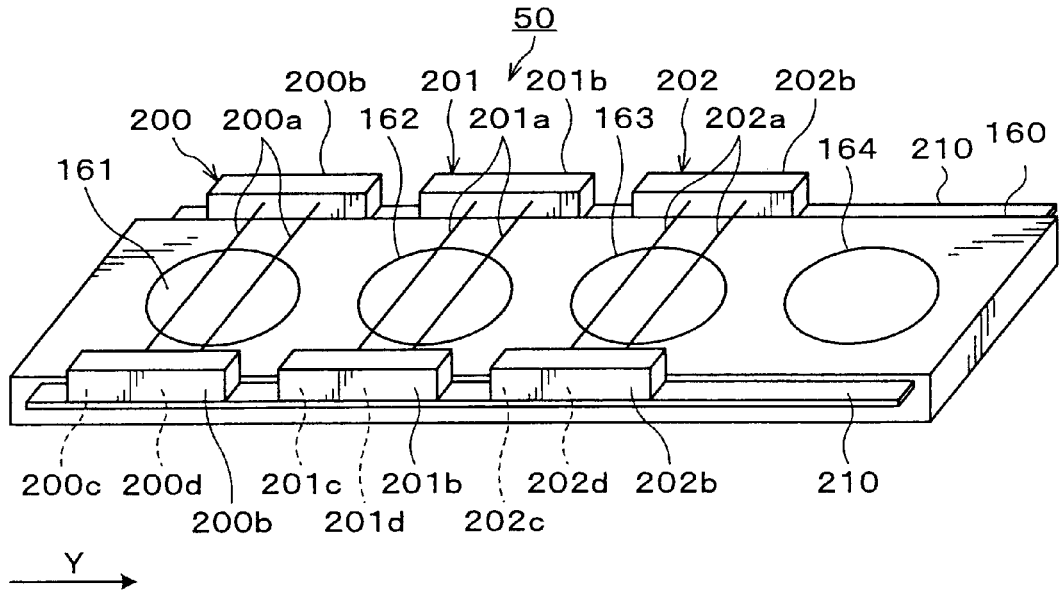
FIG. 12 is a perspective view of the inside of the heat treatment apparatus in the case using transfer members having wire portions.

While the transfer members 180 to 182 support the wafer W using their pin portions in the above embodiment, the wafer W may be supported by a plurality of wire portions. In this case, transfer members 200, 201 and 202 each having wire portions are provided, for example, in respective zones between adjacent heat treatment plates 161 to 164 as shown in FIG. 12. For example, the first transfer member 200 includes two wire portions 200a formed along the X-direction above the base 160 and holding portions 200b for holding end portions of the wire portions 200a on both side surfaces of the base 160. For example, the holding portion 200b can be raised and lowered, for example, by a raising and lowering drive portion 200c such as a cylinder provided therein. The holding portion 200b is provided on a rail 210 formed in the Y-direction, for example, on the side surface of the base 160 and can be moved on the rail 210, for example, by a horizontal drive portion 200d such as a motor provided in the holding portion 200b.

Figure 13:
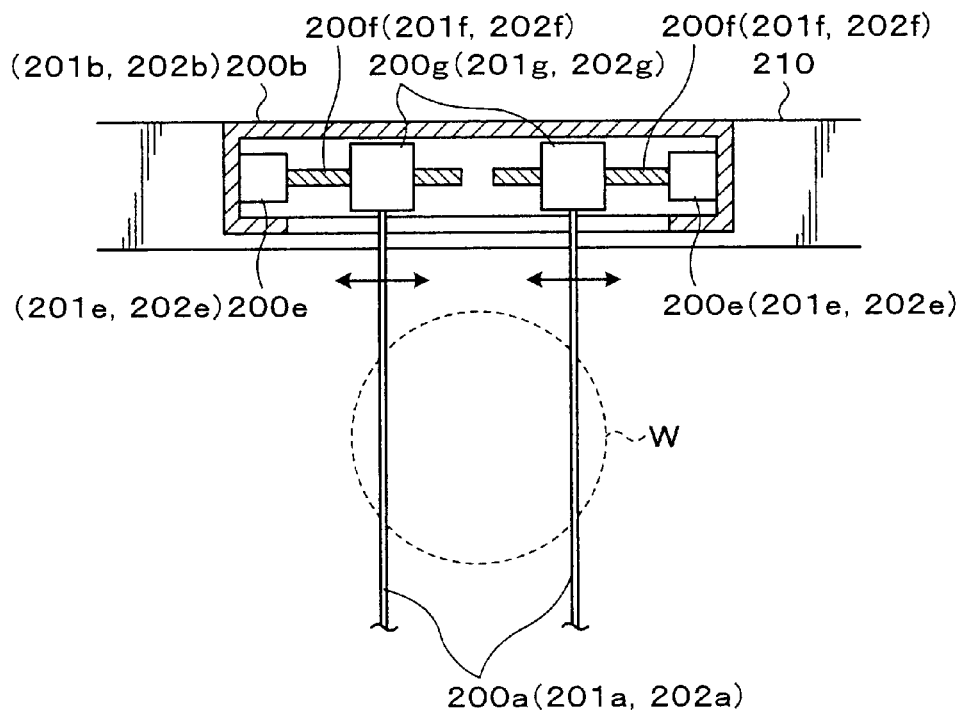
FIG. 13 is an explanatory view of a transverse section showing a configuration inside a holding portion of the transfer member.

Inside the holding portion 200b, for example, two movable bodies 200g moving in the Y-direction on guide shafts 200f by means of motors 200e, for example, as shown in FIG. 13. The movable bodies 200g hold the wire portions 200a one each. This arrangement allows the two wire portions 200a to open/close right and left, so that the two wire portions 200a open to allow the wafer W to pass through the space therebetween in the vertical direction.

The other second transfer member 201 and the third transfer member 202 have the same configuration as that of the first transfer member 200. For example, the second transfer member 201 includes, as shown in FIG. 12 and FIG. 13, wire portions 201a, holding portions 201b, raising and lowering drive portions 201c, horizontal drive portions 201d, motors 201e, guide shafts 201f, and movable bodies 201g. The third transfer member 202 includes wire portions 202a, holding portions 202b, raising and lowering drive portions 202c, horizontal drive portions 202d, motors 202e, guide shafts 202f, and movable bodies 202g.

Figure 14:
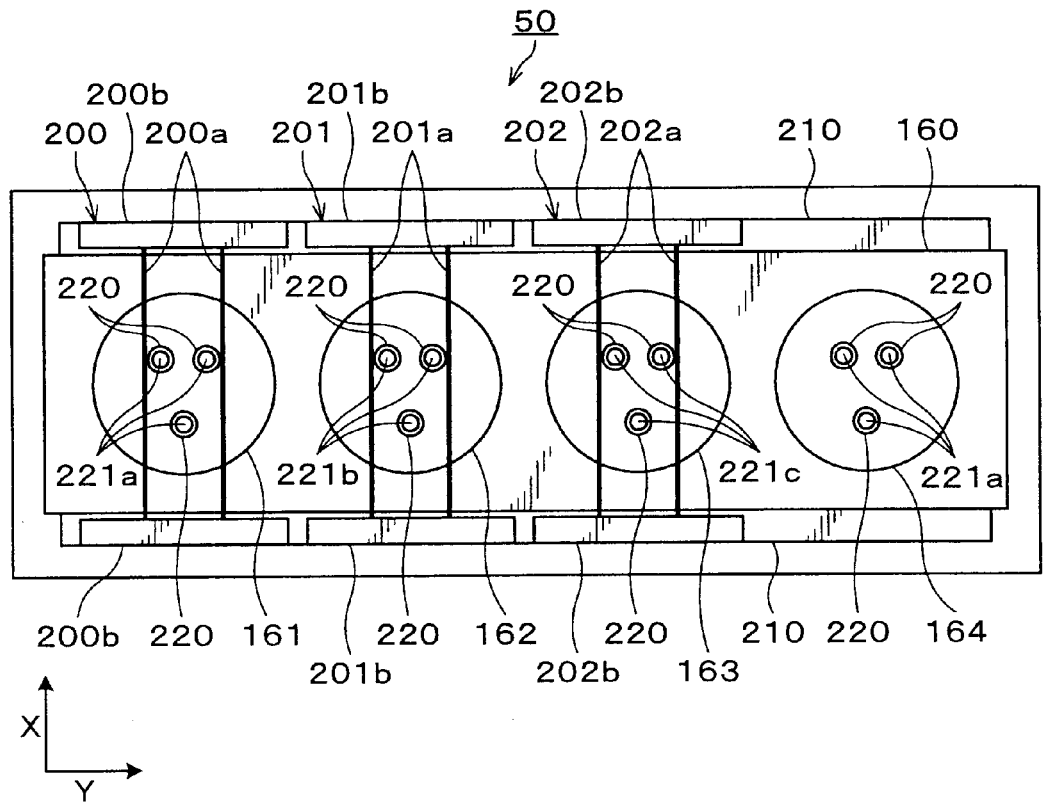
FIG. 14 is a plan view of the heat treatment apparatus.

At the middle portions of the heat treatment plates 161 to 164, as shown in FIG. 14, a plurality of holes 220 are formed, in which raising and lowering pins 221a, 221b, 221c and 221d are provided, respectively, which rise and lower while supporting the wafer W.

Figure 15:
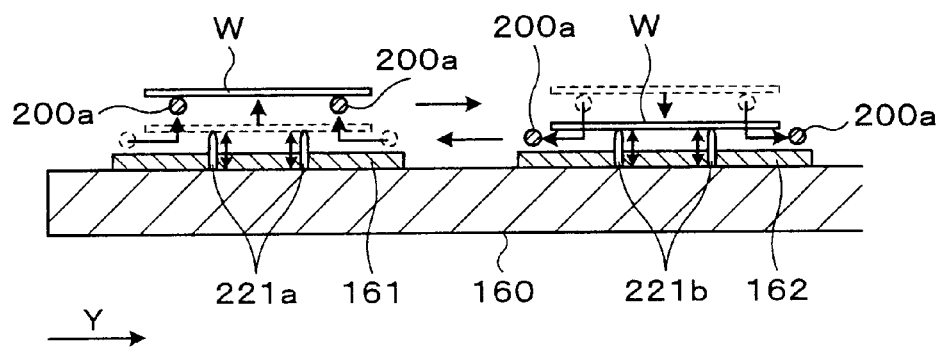
FIG. 15 is a longitudinal sectional view of a base and a heat treatment plate for explaining transfer of the wafer from the first heat treatment plate to the second heat treatment plate.

When performing the heat treatment in the heat treatment apparatus 50, the wafer W is first delivered from the main transfer unit 23 to the raising and lowering pins 221a of the first heat treatment plate 161 which have been previously raised and waiting, and mounted on the first heat treatment plate 161 by the raising and lowering pins 221a. In this event, the two wire portions 200a of the first transfer member 200 are opened wider than the diameter of the wafer W above the first heat treatment plate 161 as shown in FIG. 15 (the positions of the wire portions 200a in this event are shown by dotted lines above the first heat treatment plate 161 in FIG. 15). After completion of the heating on the first heat treatment plate 161, the wafer W is lifted by the raising and lowering pins 221a. Thereafter, the spacing between the two wire portions 200a is reduced so that the wire portions 200a are located on the lower surface side of the wafer W. In this state, for example, the wire portions 200a are raised so the wafer W is supported on the wire portions 200a (the positions of the wire portions 200a at this time are shown by solid lines above the heat treatment plate 161 in FIG. 15).

When the wafer W is supported on the wire portions 200a, the holding portions 200b are moved in the Y-direction to move the wafer W to a position above the second heat treatment plate 162 (the positions of the wire portions 200a at this time are shown by dotted lines above the heat treatment plate 162 in FIG. 15). Subsequently, for example, the wire portions 200a are lowered so that the wafer W is supported on the raising and lowering pins 221b which have been previously raised and waiting. Thereafter, the two wire portions 200a are separated again to retract to the outside of the wafer W (the positions of the wire portions 200a at this time are shown by solid lines above the heat treatment plate 162 in FIG. 15). The raising and lowering pins 221b are then lowered to mount the wafer W on the second heat treatment plate 162. The wire portions 200a are returned from above the second heat treatment plate 162 to above the first heat treatment plate 161 and wait to transfer the next wafer W.

The wafer W mounted on the second heat treatment plate 162 is heated for a predetermined time and then lifted by the raising and lowering pins 221b. Thereafter, the wafer W is delivered to the wire portions 201a of the second transfer members 201, transferred to a position above the third heat treatment plate 163 and delivered to the raising and lowering pins 221c of the third heat treatment plate 163, similarly to the above-described transfer of the wafer W by the first transfer members 200. The wafer W is then mounted on the third heat treatment plate 163 by the raising and lowering pins 221c and heated.

Thereafter, the wafer W is similarly transferred to a position above the fourth heat treatment plate 164 by the raising and lowering pins 221c and the third transfer members 202 and delivered to the raising and lowering pins 221d of the fourth heat treatment plate 164. The wafer W is then mounted on the fourth heat treatment plate 164 by the raising and lowering pins 221d and heated. The wafer W for which the heating has been completed is delivered from the raising and lowering pins 221d to the main transfer unit 23, with which a series of heat treatment steps ends.

According to this example, the transfer of the wafer W between the heat treatment plates 161 to 164 can also be appropriately performed by the transfer members 200, 201, and 202 having the wire portions. Further, since the wire portions 200a, 201a, and 202a are used to support the wafer W, the contact area between the wire portions and the wafer W can be small to prevent non-uniformity in temperature within the wafer due to thermal influence by the transfer members 200, 201 and 202.

In the example using the above-described transfer members 200 to 202 having the wire portions, the positions to support the wafer W of the transfer members 200, 201 and 202 may be changed from each other. In this case, the respective spaces between the two wire portions 200a, 201a, and 202a may be changed to change their positions to contact with the wafer W. This arrangement can prevent variation in temperature within the wafer due to the thermal influence by the transfer members 200 to 202, resulting in uniform heating of the wafer W.

Figure 16:
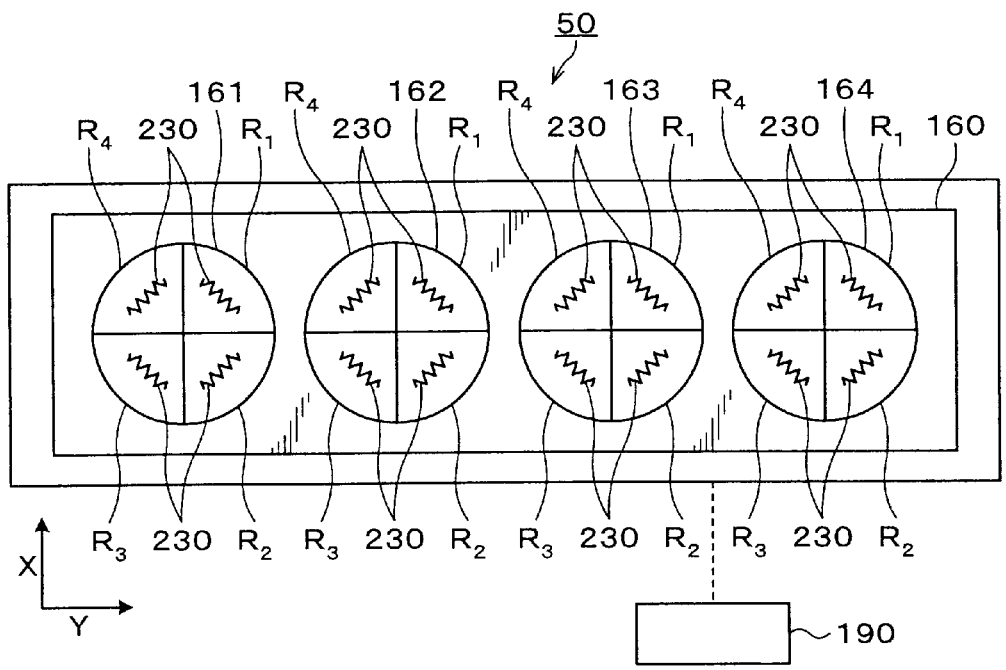
FIG. 16 is a schematic view of a heat treatment apparatus in the case in which the heat treatment plate is divided.

Each of the heat treatment plates 161 to 164 described in the above embodiment may be divided into a plurality of regions so that the temperature control may be conducted for each of the regions of each of the heat treatment plates 161 to 164. FIG. 16 shows such an example, in which, for example, each of the heat treatment plates 161 to 164 is divided radially in radial directions into four regions R1, R2, R3 and R4, and a discrete heater 230 is provided for each of the regions R1 to R4. All of the heaters 230 in the regions R1 to R4 of each of the heat treatment plates 161 to 164 are separately controlled, for example, by the control unit 190 so that the regions R1 to R4 of each of the heat treatment plates 161 to 164 are individually controlled in temperature. The temperature control of the heat treatment plates 161 to 164 by the control unit 190 is conducted such that thermal histories within the wafer W transferred to all of the heat treatment plates 161 to 164 are uniform.

In this case, the non-uniformity in temperature occurring within the wafer, for example, by one heat treatment plate can be corrected by temperature setting of the regions R1 to R4 of the plurality of heat treatment plates 161 to 164 to even out the final thermal histories within the wafer W. As a result, the dimension of the resist pattern finally formed on the wafer W can be made uniform within the wafer.

Figure 17:
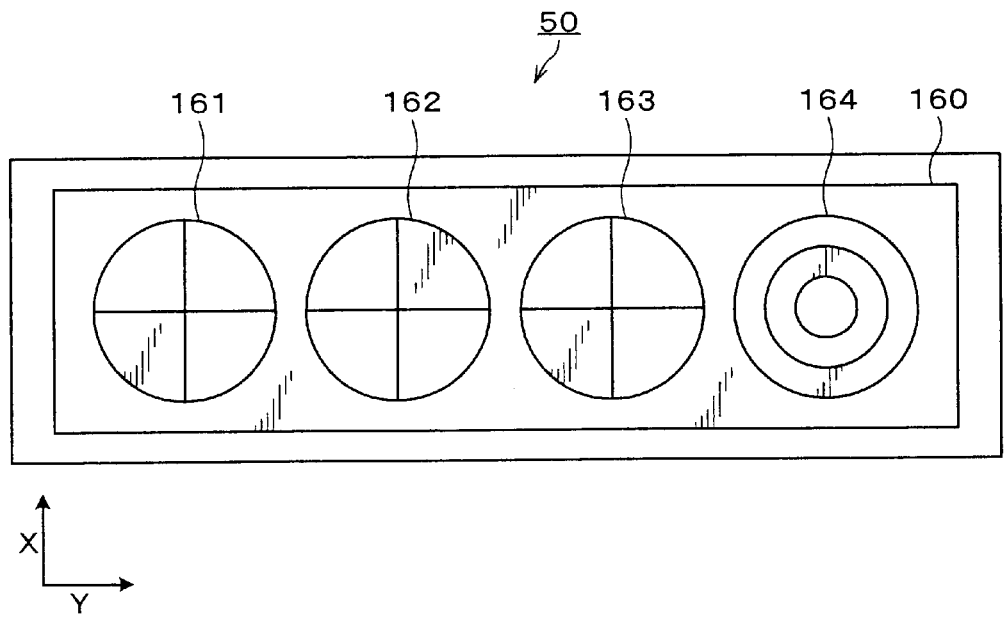
FIG. 17 is a schematic view of the heat treatment apparatus showing a division pattern of the heat treatment plate.
Figure 18:
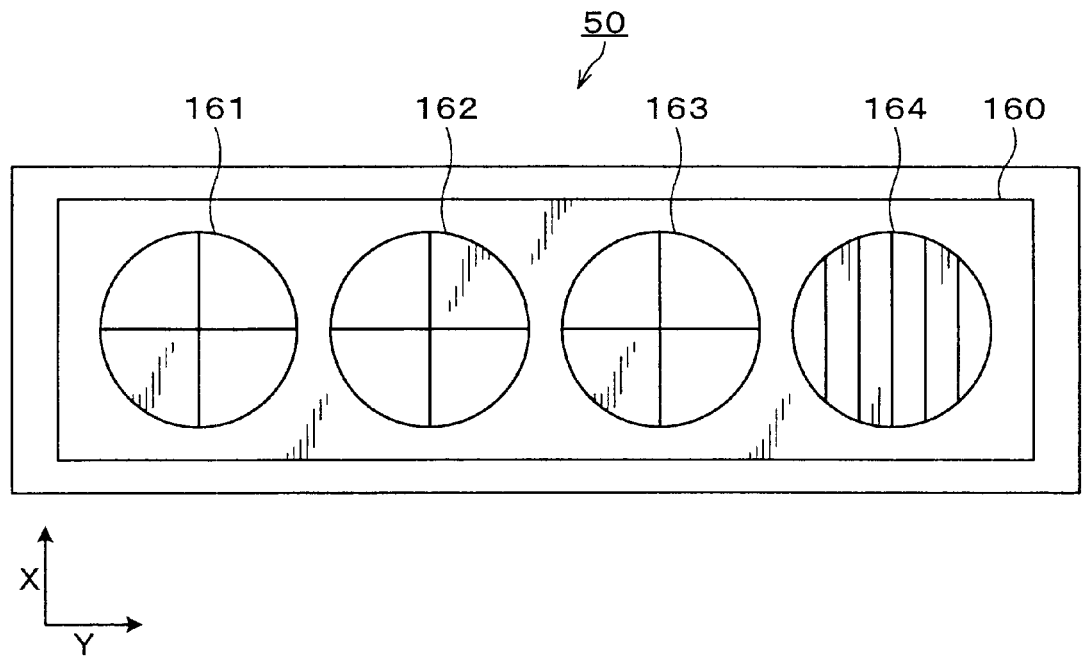
FIG. 18 is a schematic view of the heat treatment apparatus showing a division pattern of the heat treatment plate.

At least one heat treatment plate of the heat treatment plates 161 to 164 may be different in division pattern. For example, when the first to third heat treatment plate 161 to 163 are radially divided as shown in FIG. 17, the fourth heat treatment plate 164 may be concentrically divided into multiple circles. Further, for example, the fourth heat treatment plate 164 may be divided by a plurality of parallel straight lines as shown in FIG. 18. Use of the heat treatment plates in the different division patterns in combination as described above allows more precise correction in temperature within the wafer so as to make the thermal histories within the wafer uniform more precisely. The shape of the division pattern and the combination of division patterns can be arbitrarily selected, and, for example, the division patterns of all of the heat treatment plates may be different.

Figure 19:
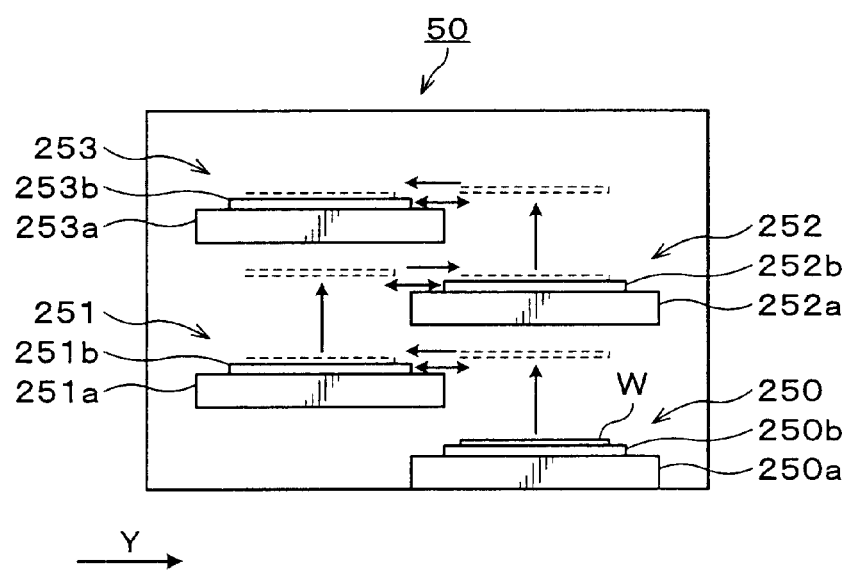
FIG. 19 is a schematic view showing the outline of a heat treatment apparatus in which heat treatment units are arranged in the vertical direction.

While the heat treatment plates 161 to 164 in the heat treatment apparatus 50 are arranged side by side in the horizontal direction in the above embodiment, they may be arranged one above the other in the vertical direction. In this case, for example, four heat treatment units 250, 251, 252 and 253 as shown in FIG. 19 are arranged one above the other in the vertical direction. The heat treatment units 250 to 253 are placed, for example, alternately in the right-to-left direction (the Y-direction) from the bottom to the above in a staggered arrangement.

Figure 20:
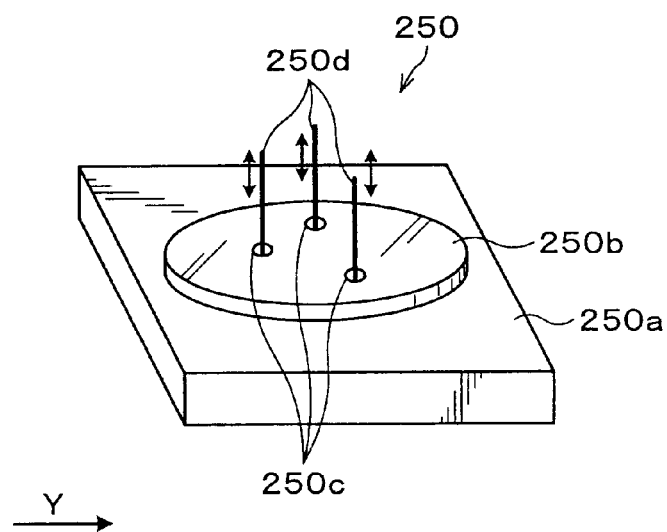
FIG. 20 is a perspective view showing a configuration of the first heat treatment portion.

The first heat treatment unit 250 on the lowermost tier includes, for example, a base 250*a* and a heat treatment plate 250*b* provided on the base 250*a* as shown in FIG. 20. At the center of the heat treatment plate 250*b*, a plurality of holes 250*c* are formed, and raising and lowering pins 250*d*, each of which can rise and lower to/from positions above the heat treatment plate 250*b*, are provided in the holes 250*c*.

Figure 21:
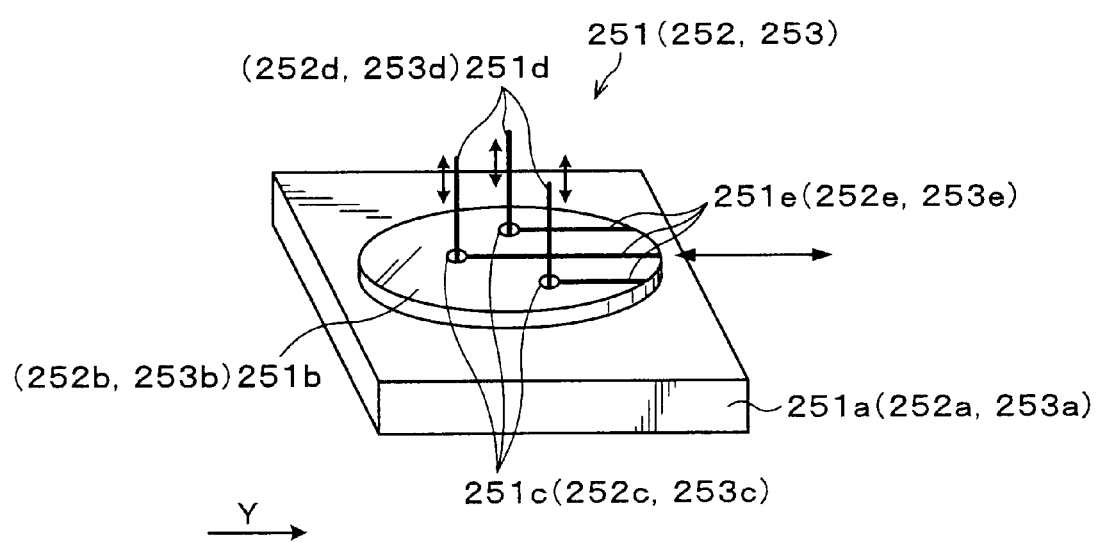
FIG. 21 is a perspective view showing a configuration of the second heat treatment unit.
Figure 22:
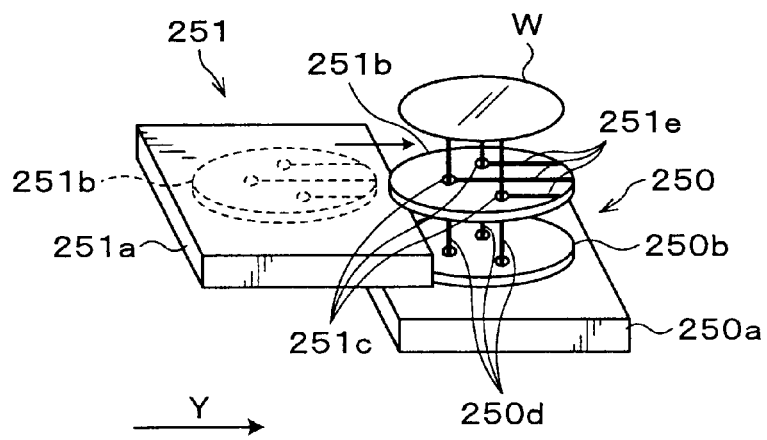
FIG. 22 is a perspective view of the first heat treatment unit and the second heat treatment unit, showing the state in which the heat treatment plate is moved.
Figure 23:
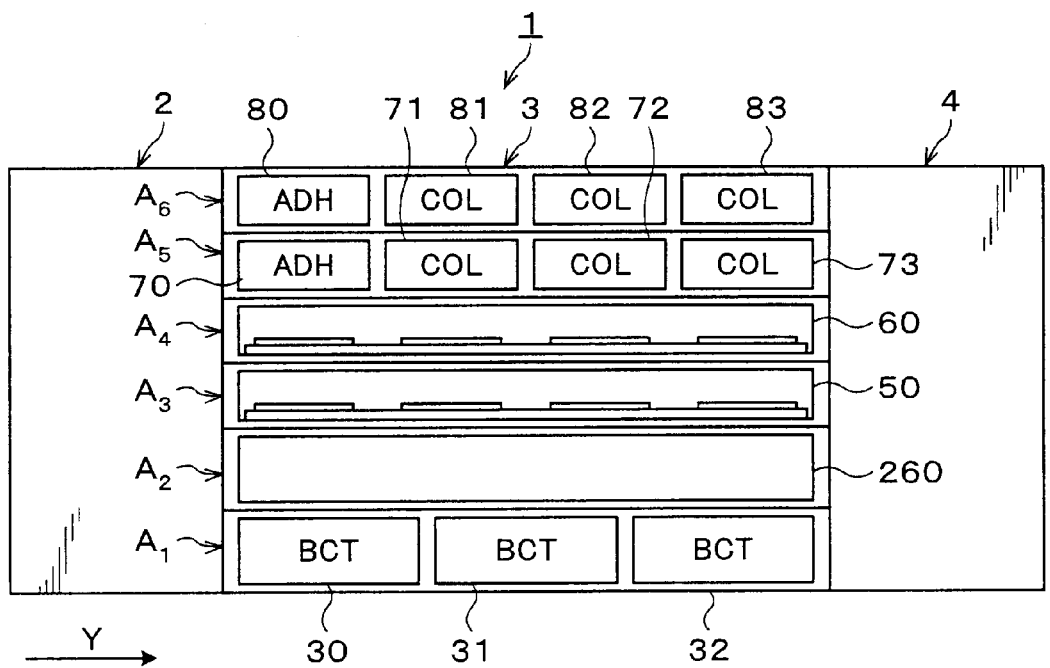
FIG. 23 is a front view of a coating and developing treatment system in which a resist coating apparatus having a plurality of treatment units is installed.

The second heat treatment unit 251 on the second tier from the bottom includes, similarly to the first heat treatment unit 250, a base 251*a*, a heat treatment plate 251*b*, holes 251*c*, and raising and lowering pins 251*d*, for example, as shown in FIG. 21. The heat treatment plate 251*b* of the second heat treatment unit 251 is movable in the positive direction of the Y-direction with respect to the base 251*a* and can protrude to a position above the first heat treatment unit 250 as shown in FIG. 22. The heat treatment plate 251*b* is formed with cutouts 251*e* leading from the end portion on the positive direction side in the Y-direction to the holes 251*c*. The cutouts 251*e* can prevent the heat treatment plate 251*b* from interfering with the raising and lowering pins 250*d* of the first heat treatment unit 250 when the heat treatment plate 251*b* protrudes the position above the first heat treatment unit 250.

The third heat treatment unit 252 and the fourth heat treatment unit 253 have the configuration as that of the second heat treatment unit 251. The third heat treatment unit 252 includes a base 252*a*, a heat treatment plate 252*b*, holes 252*c*, raising and lowering pins 252*d*, and cutouts 252*e* as shown in FIG. 21. The heat treatment plate 252*b* can move to a position above the second heat treatment unit 251 on the negative direction side in the Y-direction with respect to the base 252*a*. The fourth heat treatment unit 253 includes a base 253*a*, a heat treatment plate 253*b*, holes 253*c*, raising and lowering pins 253*d*, and cutouts 253*e*. The heat treatment plate 253*b* can move to a position above the third heat treatment unit 252 on the position direction side in the Y-direction with respect to the base 253*a*.

At the time when the pre-baking treatment is performed in the heat treatment apparatus 50, the wafer W is first mounted and heated on the heat treatment plate 250*b* of the first heat treatment unit 250. FIG. 19 shows the moving route of the wafer W in this heat treatment. Thereafter, the wafer W is lifted by the raising and lowering pins 250*d* to the same height as that of the second heat treatment unit 251 as shown in FIG. 22. The heat treatment plate 251*a* of the second heat treatment unit 251 horizontally moves in the positive direction of the Y-direction to a position under the wafer W. Subsequently, the raising and lowering pins 250*d* are lowered to mount the wafer W on the heat treatment plate 251*b*. The heat treatment plate 251*b* is returned onto the base 251*a* so that the wafer W is heated.

After completion of the heating by the second heat treatment unit 251, the wafer W is lifted by the raising and lowering pins 251*d* to the same height as that of the third heat treatment unit 252. Next, the heat treatment plate 252*b* of the third heat treatment unit 252 horizontally moves to the negative direction side in the Y-direction to a position under the wafer W. Thereafter, the raising and lowering pins 251*d* are lowered to mount the wafer W on the heat treatment plate 252*b*, and the heat treatment plate 252*b* is returned onto the base 252*a* so that the wafer W is heated.

After completion of the heating by the third heat treatment unit 252 in the similar manner, the wafer W is lifted by the raising and lowering pins 252*d* to the same height as that of the fourth heat treatment unit 253. Thereafter, the heat treatment plate 253*b* of the fourth heat treatment unit 253 moves to the positive direction side in the Y-direction to a position under the wafer W. The raising and lowering pins 252*d* are lowered to mount the wafer W on the heat treatment plate 253*b*, and the heat treatment plate 253*b* is returned onto the base 253*a* so that the wafer W is heated. Thereafter, the wafer W is transferred out of the fourth heat treatment unit 253, with which a series of pre-baking treatment steps ends.

The pre-baking treatment can be dividedly performed and every wafer W is subjected to heat treatment through the same route also in this example, thus reducing variation among the wafers in the finally formed resist pattern.

While the pre-baking treatment is divided into four parts using the four heat treatment plates in the above embodiment, the number of divided treatment parts is not limited to four but can be arbitrarily selected.

While an example in which the pre-baking treatment after the resist coating treatment is divided is mainly described in the above embodiment, other heat treatments performed in the coating and developing treatment system 1, for example, the post exposure-baking treatment and the post-baking treatment may be dividedly performed. Alternatively, the cooling treatment performed in the coating and developing treatment system 1 may be dividedly performed.

Further, while the heat treatment performed in the coating and developing treatment system 1 is dividedly performed in the above embodiment, the resist coating treatment may be dividedly performed. In this case, for example, one resist coating apparatus 260 is provided on the second tier A2 of the first treatment region 21 in the treatment station 3 of the coating and developing treatment system 1 as shown in FIG.

Figure 24:
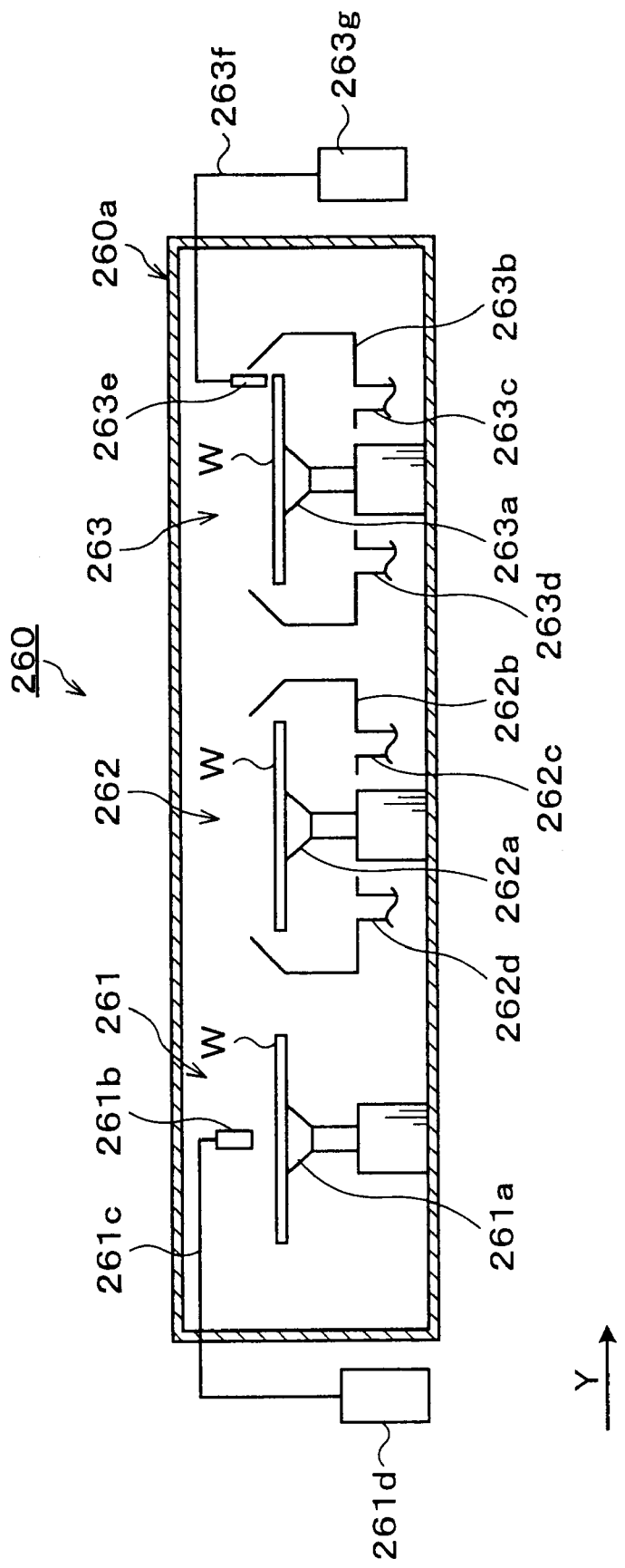
FIG. 24 is a longitudinal sectional view showing the outline of a resist coating apparatus.
Figure 25:
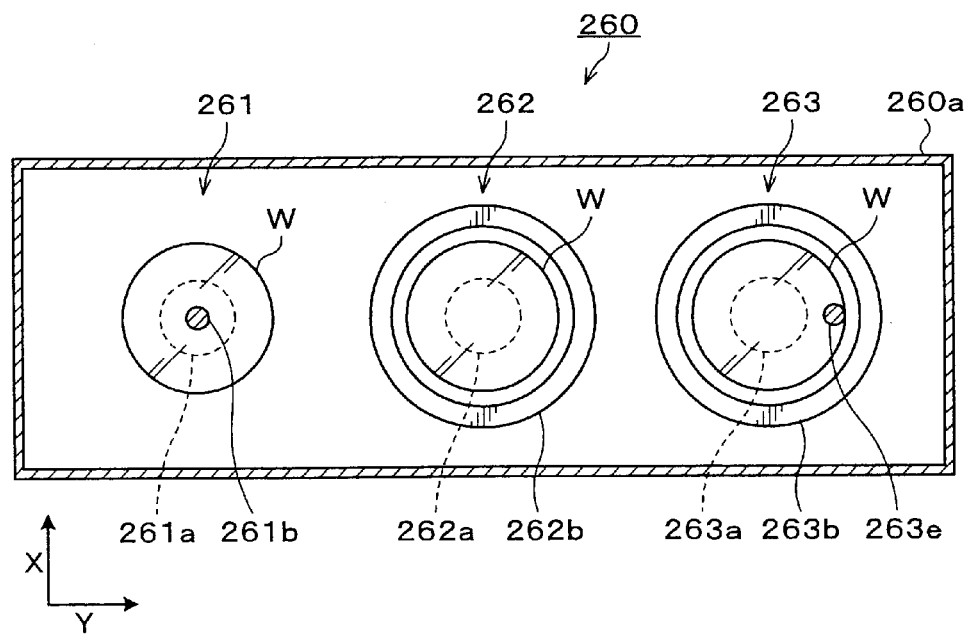
FIG. 25 is an explanatory view of a transverse section showing the outline of the configuration of the resist coating apparatus.

23. The resist coating apparatus 260 includes, for example, a discharge treatment unit 261, a spread treatment unit 262, and a drying treatment unit 263 being three treatment units in a casing 260a as shown in FIG. 24 and FIG. 25. The discharge treatment unit 261, the spread treatment unit 262, and the drying treatment unit 263 are provided, for example, side by side in this order toward the positive direction side in the Y-direction.

The discharge treatment unit 261 includes a chuck 261a, for example, for horizontally holding the wafer W. Above the central portion of the chuck 261a, a first nozzle 261b for discharging the resist solution is provided. The first nozzle 261b is connected to a resist solution supply source 261d, for example, via a supply pipe 261c.

The spread treatment unit 262 includes, for example, a spin chuck 262a for horizontally holding and rotating the wafer W. Around the spin chuck 262a, a cup 262b is provided which receives the liquid scattering or dropping from the wafer W for collection. To the lower surface of the cup 262b, a drainage pipe 262c for draining the collected liquid and an exhaust pipe 262d for exhausting the atmosphere in the cup 262b are connected.

The drying treatment unit 263 includes, for example, a spin chuck 263a for horizontally holding and rotating the wafer W. Around the spin chuck 263a, a cup 263b is provided. To the lower surface of the cup 263b, a drainage pipe 263c and an exhaust pipe 263d are connected. Above the peripheral portion of the wafer W held on the spin chuck 263a, a second nozzle 263e for discharging the solvent for the resist solution is provided. The second nozzle 263e is connected to a solvent supply source 263g, for example, via a supply pipe 263f. This allows the solvent to be discharged from the second nozzle 263e to the peripheral portion of the wafer W so as to dissolve the resist solution at the peripheral portion of the wafer W for removal.

The resist coating apparatus 260 is configured as described above. At the time when performing the resist coating treatment in the resist coating apparatus 260, the wafer W is first transferred by the main transfer unit 23 to the discharge treatment unit 261 in the resist coating apparatus 260. In the discharge treatment unit 261, the wafer W is suction-held on the chuck 261a, and a predetermined amount of resist solution is supplied from the first nozzle 261b onto the central portion of the wafer W.

Next, the wafer W is transferred, for example, by the main transfer unit 23 to the spread treatment unit 262. In the spread treatment unit 262, the wafer W is suction-held on the spin chuck 262a and rotated at a predetermined rotation speed. This spreads the resist solution on the wafer W outward to form a resist film with a predetermined thickness on the front surface of the wafer W.

Subsequently, the wafer W is transferred, for example, by the main transfer unit 23 to the drying treatment unit 263. In the drying treatment unit 263, the wafer W is suction-held on the spin chuck 263a and rotated at a high speed. This dries the resist film on the wafer W. Further, the solvent is supplied from the second nozzle 263e to the peripheral portion of the wafer W to remove the unnecessary resist film at the peripheral portion of the wafer W.

The wafer W for which the drying treatment has been completed in the drying treatment unit 263 is transferred out of the resist coating apparatus 260 by the main transfer unit 23, with which a series of resist coating steps ends. Into the resist coating apparatus 260, the wafers W are successively transferred, for example, by the main transfer unit 23, and the wafers W are transferred to the treatment units 261, 262, and 263 in order where a plurality of wafers W are successively treated during the same time.

According to this example, the resist coating treatment can be dividedly performed in the three treatment units 261 to 263. In this case, the wafers W are subjected to the resist coating treatment through the same route, so that the resist films with the same thickness can be formed on the wafers W. As a result of forming the resist films with the same thickness among the wafers, the exposure processing and the developing treatment thereafter can be uniformly performed to uniform the resist patterns finally formed on the wafers W.

Note that while the transfer of the wafer W between the three treatment units 261 to 263 is performed by the main transfer unit 23 in the above example, a sub-transfer unit may be provided in the resist coating apparatus 260 so that the sub-transfer unit is used to transfer the wafers W to the treatment units 261, 262, and 263 in order.

Figure 26:
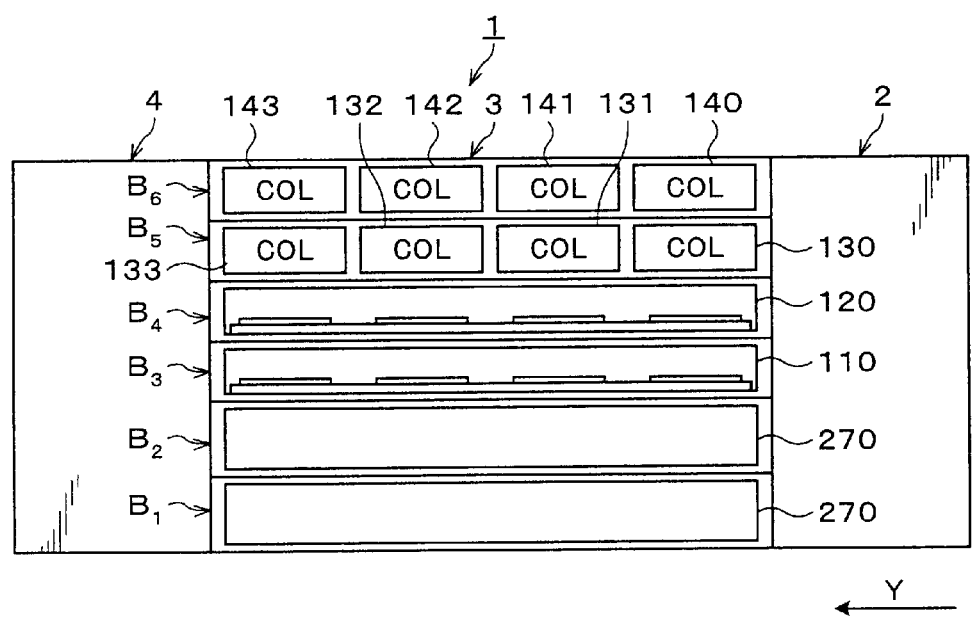
FIG. 26 is a rear view of a coating and developing treatment system in which developing treatments apparatus having a plurality of treatment units are installed.
Figure 27:
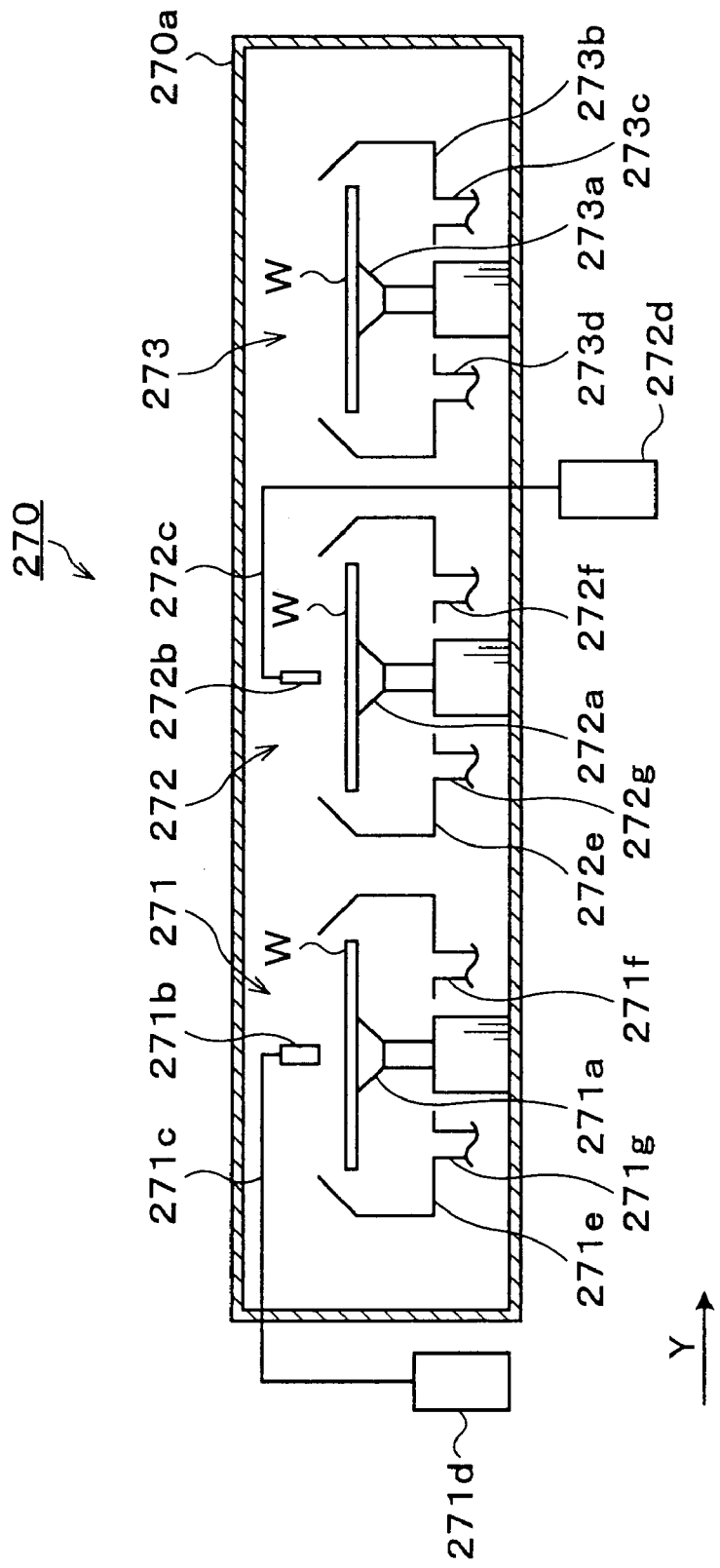
FIG. 27 is a longitudinal sectional view showing the outline of a configuration of a developing treatment apparatus.
Figure 28:
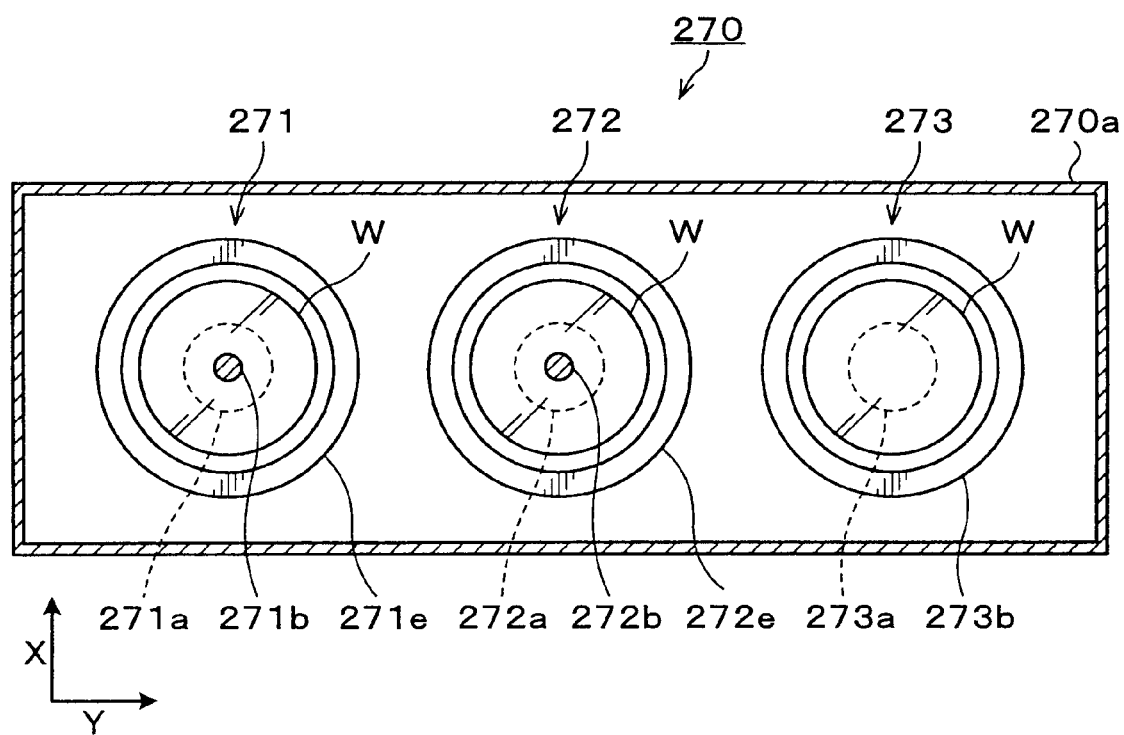
FIG. 28 is an explanatory view of a transverse section showing the outline of a configuration of the developing treatment apparatus.

Other than the resist coating treatment, the developing treatment performed in the coating and developing treatment system 1 may be dividedly performed. In this case, developing treatment apparatuses 270 are provided respectively, for example, on the first tier B1 and the second tier B2 of the second treatment region 22 in the treatment station 3 in the coating and developing treatment system 1 as shown in FIG. 26. The developing treatment apparatus 270 includes, for example, a developing solution supply treatment unit 271, a cleaning solution supply treatment unit 272, and a drying treatment unit 273 being three treatment units in a casing 270a as shown in FIG. 27 and FIG. 28. The developing solution supply treatment unit 271, the cleaning solution supply treatment unit 272, and the drying treatment unit 273 are provided, for example, side by side in this order toward the positive direction side in the Y-direction.

The developing solution supply treatment unit 271 includes a spin chuck 271a, for example, for horizontally holding and rotating the wafer W. Above the central portion of the spin chuck 271a, for example, a first nozzle 271b for discharging the developing solution is provided. The first nozzle 271b is connected to a developing solution supply source 271d, for example, via a supply pipe 271c. Around the spin chuck 271a, a cup 271e is provided which receives the liquid scattering or dropping from the wafer W for collection. To the lower surface of the cup 271e, a drainage pipe 271f for draining the collected liquid and an exhaust pipe 271g for exhausting the atmosphere in the cup 271e are connected.

The cleaning solution supply treatment unit 272 includes a spin chuck 272a, for example, for horizontally holding and rotating the wafer W. Above the central portion of the spin chuck 272a, a second nozzle 272b for discharging the cleaning solution such as pure water is provided. The second nozzle 272b is connected to a cleaning solution supply source 272d, for example, via a supply pipe 272c. Around the spin chuck 272a, a cup 272e is provided. To the lower surface of the cup 272e, a drainage pipe 272f and an exhaust pipe 272g are connected.

The drying treatment unit 273 includes, for example, a spin chuck 273a for horizontally holding and rotating the wafer W. Around the spin chuck 273a, a cup 273b is provided. To the lower surface of the cup 273b, a drainage pipe 273c and an exhaust pipe 273d are connected.

The developing treatment apparatus 270 is configured as described above. At the time when the developing treatment is performed in the developing treatment apparatus 270, the wafer W is first transferred by the main transfer unit 23 to the developing solution supply treatment unit 271. In the developing solution supply treatment unit 271, the wafer W is suction-held on the chuck 271a and rotated at a predetermined rotation speed. To the central portion of the rotated wafer W, the developing solution is supplied from the first nozzle 271b. This supplies the developing solution over the entire surface of the wafer W.

Next, the wafer W is transferred, for example, by the main transfer unit 23 to the cleaning solution supply treatment unit 272. In the cleaning solution supply treatment unit 272, the wafer W is suction-held on the spin chuck 272a and rotated. To the central portion of the rotated wafer W, the cleaning solution is supplied from the second nozzle 272b. This replaces the developing solution on the wafer W with the cleaning solution to stop the development.

Subsequently, the wafer W is transferred, for example, by the main transfer unit 23 to the drying treatment apparatus 273. In the drying treatment apparatus 273, the wafer W is suction-held on the spin chuck 273a and rotated at a high speed. This shakes off the cleaning solution on the wafer W to thereby dry the wafer W.

The wafer W for which the drying treatment in the drying treatment unit 273 has been completed is transferred out of the developing treatment apparatus 270 by the main transfer unit 23, with which a series of developing treatment steps ends. Into the developing treatment apparatus 270, the wafers W are successively transferred, for example, by the main transfer unit 23, and the wafers W are transferred to the treatment units 271, 272, and 273 in order where a plurality of wafers W are successively treated during the same time.

According to this example, the developing treatment can be dividedly performed in the three treatment units 271 to 273. In this case, the wafers W are subjected to the developing treatment through the same route, so that the resist films on the wafers W are subjected to the same development. This results in reduced variation among wafers in the finally resist pattern formed on the wafer W.

Note that while the transfer of the wafer W between the three treatment apparatuses 271 to 273 is performed by the main transfer unit 23 in the above example, a sub-transfer unit may be provided in the developing treatment apparatus 270 so that the sub-transfer unit is used to transfer the wafers W to the treatment units 271, 272, and 273 in order.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

While, for example, the heat treatment such as the pre-baking treatment, the post exposure-baking treatment, or the post-baking treatment, the resist coating treatment, or the developing treatment is dividedly performed in a plurality of treatment units in the above embodiments, the present invention is not limited to such treatment, but other treatments in the photolithography process performed in the coating and developing treatment system 1, may be dividedly performed in a plurality of treatment units. If, for example, a bottom coating treatment is performed before the resist coating treatment, the bottom coating treatment and heat treatment and cooling treatment immediately after the bottom coating treatment may be dividedly performed in a plurality of treatment units. Further, the adhesion treatment and the cooling treatment immediately after the adhesion treatment may be dividedly performed in a plurality of treatment units. Further, all of the above-described treatments performed in the coating and developing treatment system 1 may be dividedly performed, or any number of those treatments may be dividedly performed.

The present invention may also be applied to the treatment system for other substrates such as an FPD (Flat Panel Display), a mask reticle for a photomask, and the like other than the wafer. The present invention is useful in suppressing variation among substrates in resist pattern.

What is claimed is:

1. A substrate treatment method for forming a resist pattern on a substrate, comprising:
   at least a coating treatment of applying a resist solution to the substrate, a substrate developing treatment, and a substrate heat treatment,
   wherein at least any of said coating treatment, developing treatment, and heat treatment is performed by transferring the substrates one by one in a predetermined order to a plurality of treatment units where the treatment is dividedly performed, provided in a casing, by a substrate transfer mechanism capable of successively transferring substrates in said plurality of treatment units.

2. The substrate treatment method as set forth in claim 1, wherein the treatment dividedly performed in the plurality of treatment units comprises the coating treatment, and
   wherein, in the coating treatment, a discharge treatment of discharging the resist solution onto the substrate, a spread treatment of rotating the substrate to spread the resist solution over the substrate, and a drying treatment of drying the substrate are performed in the respective treatment units.

3. The substrate treatment method as set forth in claim 2, wherein a treatment of removing the resist solution at a peripheral portion of the substrate is performed in the treatment unit for performing the drying treatment.

4. The substrate treatment method as set forth in claim 1, wherein said treatment dividedly performed in the plurality of treatment units comprises the developing treatment, and
   wherein, in the developing treatment, a developing solution supply treatment of supplying a developing solution to the substrate, a cleaning solution supply treatment of supplying a cleaning solution onto the substrate, and a drying treatment of drying the substrate are performed in the respective treatment units.

5. The substrate treatment method as set forth in claim 1, wherein the treatment dividedly performed in the plurality of treatment units comprises the heat treatment, and
   wherein the heat treatment is performed in a plurality of heat treatment units for heating the substrate at the same temperature.

* * * * *